United States Patent
Song et al.

(10) Patent No.: US 6,856,154 B2
(45) Date of Patent: Feb. 15, 2005

(54) TEST BOARD FOR TESTING IC PACKAGE AND TESTER CALIBRATION METHOD USING THE SAME

(75) Inventors: Yoon-gyu Song, Suwon (KR); Ki-seok Jeon, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/732,481

(22) Filed: Dec. 11, 2003

(65) Prior Publication Data

US 2004/0119487 A1 Jun. 24, 2004

(30) Foreign Application Priority Data

Dec. 13, 2002 (KR) ................................ 10-2002-0079635

(51) Int. Cl.[7] ............................................. G01R 31/02
(52) U.S. Cl. .................................... 324/754; 324/158.1
(58) Field of Search ................. 324/73.1, 74, 754–755, 324/763, 765, 158.1; 714/700, 726, 731, 733–734; 702/79, 106, 118, 120–126

(56) References Cited

U.S. PATENT DOCUMENTS

| | | | | |
|---|---|---|---|---|
| 5,237,268 A | * | 8/1993 | Honma et al. | 324/754 |
| 5,539,305 A | * | 7/1996 | Botka | 324/158.1 |
| 6,492,797 B1 | * | 12/2002 | Maassen et al. | 324/74 |
| 6,570,397 B2 | * | 5/2003 | Mayder et al. | 324/754 |

* cited by examiner

Primary Examiner—Minh N. Tang
(74) Attorney, Agent, or Firm—Volentine Francos & Whitt, PLLC

(57) ABSTRACT

A test board is selectively usable as an interface between an integrated circuit device under test (DUT), such as a ball grid array package, and an automatic test equipment (ATE), and as an interface between a calibration apparatus and the ATE. The test board includes a socket, for electrically connecting to the ATE, which includes a plurality of contact terminals which are configured to directly contact terminals of the DUT during a test operation and to directly contact probes of the calibration apparatus during a calibration operation. The test board also includes an alignment mark which is positioned adjacent the socket and which can be sensed by the calibration apparatus during the calibration operation, and a test pad which is positioned adjacent the socket and which is configured to directly contact a test probe of the calibration apparatus for checking an operational state of the calibration apparatus.

9 Claims, 5 Drawing Sheets

US 6,856,154 B2

TEST BOARD FOR TESTING IC PACKAGE AND TESTER CALIBRATION METHOD USING THE SAME

BACKGROUND OF THE INVENTION

1. Field of the Invention

The present invention generally relates to the testing of integrated circuit (IC) packages, and more particularly, the present invention relates to a test board for testing ball grid array (BGA) packages or micro ball grid array ($\mu$-BGA) packages, and to a method of calibrating a tester for testing BGA or $\mu$-BGA packages.

A claim of priority is made to Korean Patent Application No. 2002-79635, filed Dec. 13, 2002, in the Korean Intellectual Property Office, the entire contents of which are incorporated herein by reference.

2. Description of the Related Art

Integrated circuits (ICs) and IC packages are analyzed for various characteristics, e.g., DC and AC characteristics, and/or tested for defects. To accomplish such analysis, a test board is used to electrically connect a main load board to a device under test (DUT), where the main load board is connected to automatic test equipment (ATE). In addition, as explained in more detail below, the test board is used in combination with a jig set during an ATE calibration process.

FIG. 1 illustrates a conventional test board used for testing a conventional "thin small outline package" (TSOP). Generally, TSOP's are packages which are not BGA or $\mu$-BGA packages. As shown in FIG. 1, a test board 100 includes a printed circuit board (PCB: not shown) and sockets 10 mounted on the PCB. The sockets 10 have a plurality of contact terminals 20 for connection to the pins of a DUT (TSOP).

Prior to testing the DUT using the ATE, the ATE must first be calibrated to identify and compensate for measurement errors (such as timing errors) that may occur in channels of the ATE. Accordingly, a calibration apparatus is needed to measure such errors. For example, in a case where a TSOP is tested by a T559X series ADVANTEST® (which is an ATE made by ADVANTEST Corporation), errors in the T559X series ADVANTEST® are calibrated using a calibration robot.

In this case, referring again to FIG. 1, the contact terminals 20 of the sockets 10 into which the pins of the DUT are inserted are positioned at opposite sides of a region 30 in which probes of the calibration robot are positioned. Thus, for example, when the TSOP is tested by the T559X series ATE, an additional jig is necessary to electrically connect the probes of the calibration robot to the sockets 10 of the test board.

A well-known process of testing a TSOP using the T559X series ADVANTEST® ATE will be briefly described with reference to FIGS. 1 through 3.

FIG. 2 illustrates a jig set 200 used when calibrating an ATE using the test board shown in FIG. 1. The jig set 200 includes a PCB contact 210, a probing PCB 220, and a PCB guide template 230. FIG. 3 is a block diagram for explaining the calibration of an ATE using the jig set 200 shown in FIG. 2.

Referring to FIG. 3, an ATE 350 is connected to a main load board 320 via wire cables 351. The main load board 320 is connected to a test board 100 via wire cables 340. The test board 100 is supported by a supporter 330.

The PCB contact 210, the probing PCB 220, and the PCB guide template 230 of the jig set 200 (FIG. 2) are sequentially stacked on the test board 100. The PCB contact 210 electrically connects the sockets 10 (FIG. 1) mounted on the test board 100 to the probing PCB 220 via contact pins 31. The probing PCB 220 is for connection to probes 313 of an arm 311 of the calibration robot 310 via the probing points 30.

The PCB guide template 230 has holes 32 into which screws for fixing the PCB contact 210 and the probing PCB 220 onto the test board 100 are inserted.

When a calibration operation for calibrating the ATE 350 is performed, the jig set 200 components are mounted on the test board 100 as above, and then the arm 311 of the calibration robot 310 descends toward the probing PCB 220 to probe the probing points 30 of the probing PCB 220.

The calibration robot 310 receives test signals output from channels of the ATE 350 via the probes 313 of the arm 311 to measure characteristics (such as delay times) of a signal transmitted between the channels of the ATE 350 and the sockets 10 of the test board 100, and stores the measured data in a memory (not shown) of the ATE 350. The measured channels characteristics of the ATE 350 can vary depending on the characteristics of the wire cables 351 and 340 connected to the channels of the ATE 350.

After the ATE calibration process, when the DUT is tested by the ATE 350 (hereinafter referred to as a test operation), the components of the jig set 200 are detached from the test board 100 and the pins of the DUT are inserted into the sockets 10 on the test board 100.

The channels of the ATE 350 output test signals to the sockets 10 via the wire cables 340 and 351, and then the ATE 350 receives returned test signals via the sockets 10 and the wire cables 340 and 351. The ATE compensates for signal delay times in the received test signals using the data measured by the calibration robot 310.

As described above, the components of the jig set 200 must be attached to the test board 100 whenever the ATE 350 is calibrated, and then detached from the test board whenever the DUT is tested. Thus, time is disadvantageously expended during the attachment and detachment of the jig set 200.

Also, calibration errors, and thus DUT analysis errors, can arise when the components of the jig set 200 are not precisely attached onto the test board 100. Further, the number of jigs increases with an increase in the number of DUTs. Additional jigs increase overall costs, and it takes a significant amount of time to attach and detach a plurality of jigs onto and from the test board 100.

SUMMARY OF THE INVENTION

According to an aspect of the present invention, there is provided a test board which is selectively usable as an interface between an integrated circuit device under test (DUT), such as a ball grid array package, and an automatic test equipment (ATE), and as an interface between a calibration apparatus and the ATE. The test board includes a socket, for electrically connecting to the ATE, which includes a plurality of contact terminals which are configured to directly contact terminals of the DUT during a test operation and to directly contact probes of the calibration apparatus during a calibration operation. The test board also includes an alignment mark which is positioned adjacent the socket and which can be sensed by the calibration apparatus during the calibration operation, and a test pad which is positioned adjacent the socket and which is configured to directly contact a test probe of the calibration apparatus for checking an operational state of the calibration apparatus.

According to another aspect of the present invention, there is provided a system for testing an integrated circuit device under test (DUT) having contact terminals. The system includes an automatic test equipment (ATE), a calibration apparatus having contact probes for calibrating the ATE and having a test probe for checking an operational state of the calibration apparatus, and a test board. The test board includes (a) a socket, which is electrically connected to the ATE, and which includes a plurality of contact terminals which are configured to directly contact the contact terminals of the DUT during a test operation and to directly contact the contact probes of the calibration apparatus during a calibration operation, (b) an alignment mark which is positioned adjacent the socket and which can be sensed by the calibration apparatus during the calibration operation, and (c) a test pad which is positioned adjacent the socket and which is configured to directly contact the test probe of the calibration apparatus.

According to another aspect of the present invention, there is provided a method of calibrating an automatic test equipment (ATE) which tests an integrated circuit device under test (DUT). The ATE is electrically connected to a socket of a test board, the socket including a plurality of contact terminals which are configured to directly contact the terminals of the DUT during a test operation. An alignment mark positioned adjacent the socket is used to align a calibration apparatus with the test board. A test pad positioned adjacent the socket is directly contacted with a test probe of the calibration apparatus to determine whether the calibration apparatus is operating correctly, and contact terminals of the socket are directly contacted with calibration probes of the calibration apparatus to detect calibration data for calibrating the ATE.

BRIEF DESCRIPTION OF THE DRAWINGS

The above features and advantages of the present invention will become more readily apparent from the detailed description that follows, with reference to the accompanying drawings, in which.

DETAILED DESCRIPTION OF THE PREFERRED EMBODIMENTS

Figure 1:
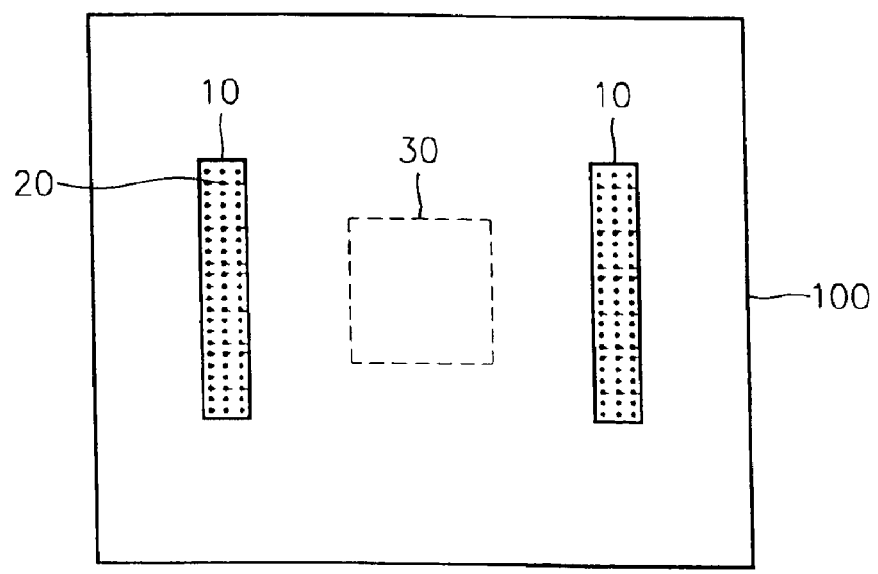
FIG. 1 illustrates a test board used for testing a conventional TSOP.
Figure 2:
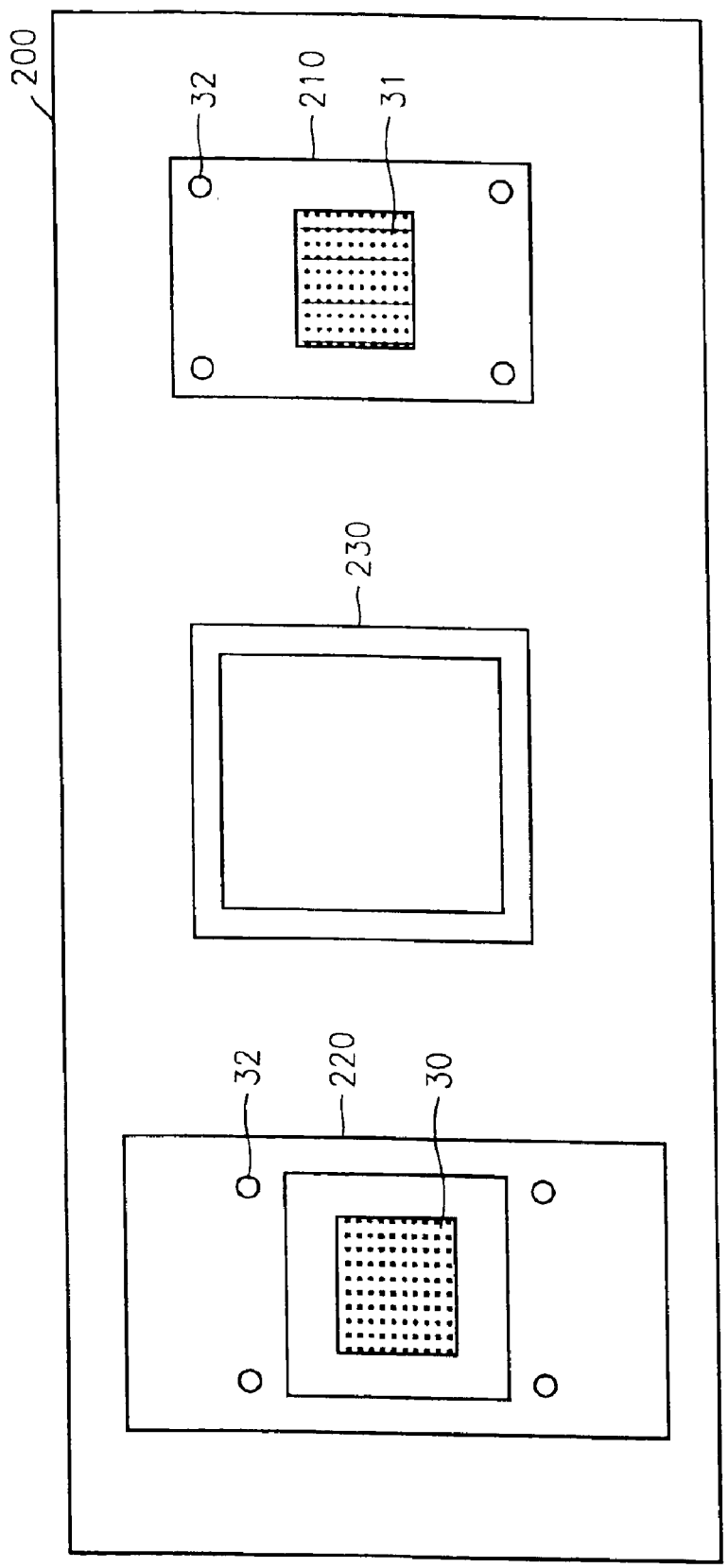
FIG. 2 illustrates a jig set used with the test board shown in FIG. 1 when calibrating an automatic test equipment (ATE)
Figure 3:
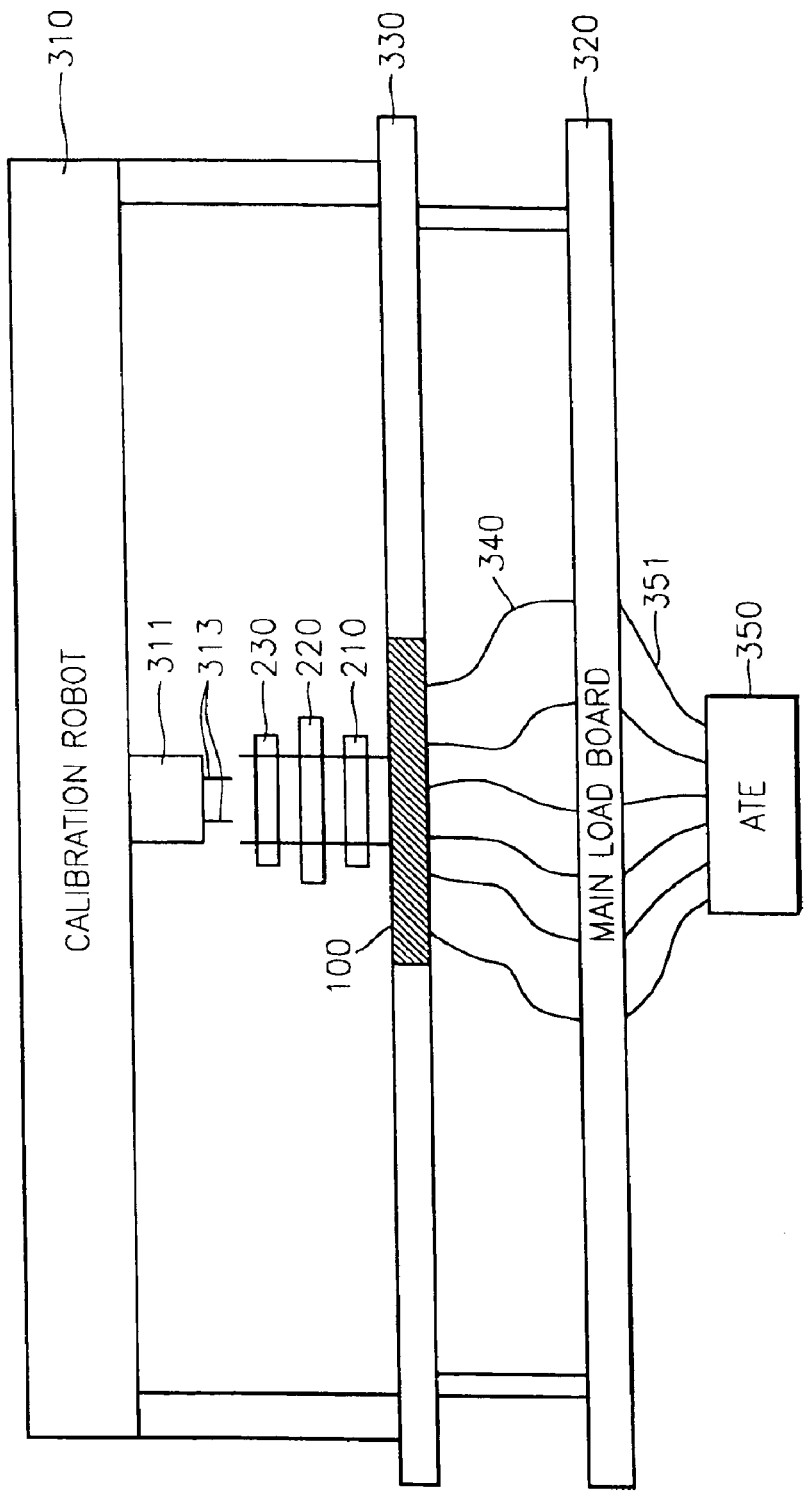
FIG. 3 is a block diagram for explaining the calibration of an ATE using the jig set shown in FIG. 2.

Hereinafter, preferred embodiments of the present invention are described in detail below with reference to the accompanying drawings. Like reference numerals denote like elements throughout the drawings.

Figure 4:
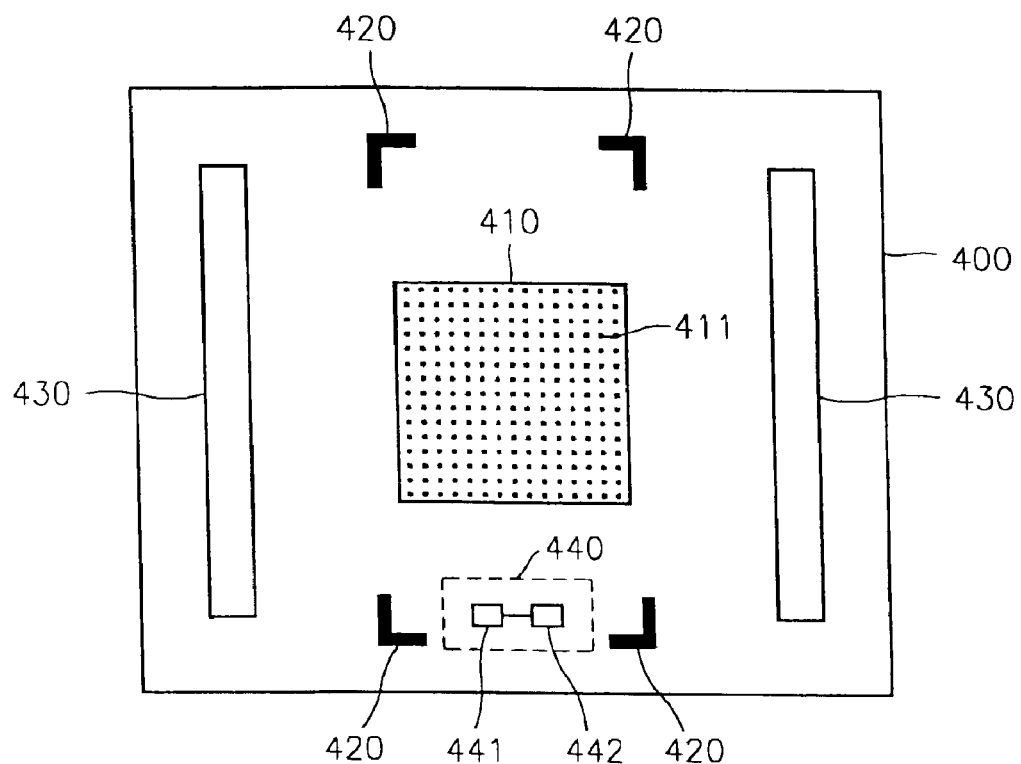
FIG. 4 illustrates a test board according to an embodiment of the present invention.
Figure 5:
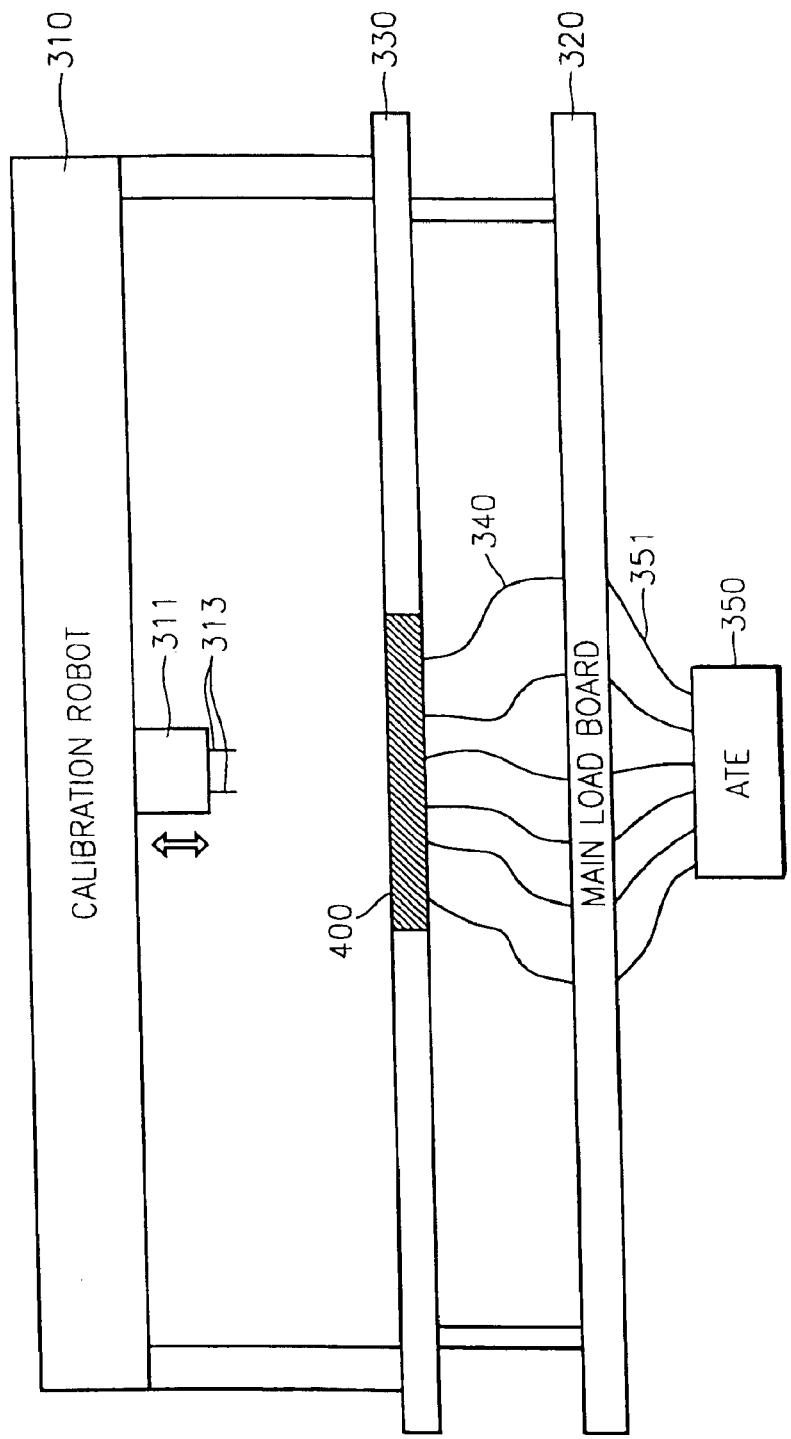
FIG. 5 is a block diagram for explaining the calibration of an ATE using the test board shown in FIG. 4.

FIG. 4 illustrates a test board according to an embodiment of the present invention, and FIG. 5 is a block diagram for explaining the calibration of an ATE using the test board shown in FIG. 4.

Referring to FIG. 4, a test board 400 includes a socket 410 mounted on a PCB (not shown), at least one alignment mark 420, a pad 440, and contact terminals 430. As explained below, the socket 410 includes a plurality of contact terminals 411 that contact either the probes 313 of the calibration robot 310 or the spherical surface contacts of a DUT, such as a BGA package or a μ-BGA package.

Referring to FIGS. 4 and 5, during an ATE 350 calibration operation, the contact terminals 411 of the socket 410 directly contact the probes 313 of the arm 311 of the calibration robot 310. On the other hand, during a DUT test operation, the contact terminals 411 of the socket 410 electrically contacts spherical contacts arranged on the DUT. The spherical contacts may, for example, be in the form of contact balls or hemispheric contacts.

Accordingly, since the test board 400 for testing the BGA package or the μ-BGA package does not need an additional jig set when calibrating the ATE, the jig set does not have to be attached and then detached prior to and subsequent to each calibration operation.

Also, since the contact terminals 411 of the socket 410 directly contact the probes 313 of the arm 311 of the calibration robot 310 during the calibration operation, the probes 313 of the calibration robot 310 are precisely aligned with the contact terminals 411 of the socket 410. Thus, calibration data measured by the calibration robot 310 is accurate.

The at least one alignment mark 420 is used to align the test board 400 with the calibration robot 310. Here, a camera (not shown) installed in the calibration robot 310 senses the at least one alignment mark 420 so that the calibration robot 310 is aligned with the test board 400. Preferably, the at least one alignment mark 420 encloses or surrounds the socket 410.

As shown in FIG. 4, the pad 440 is preferably composed of pads 441 and 442 which are connected to each other and allow the calibration robot 310 to check whether the probes 313 of the arm 311 of the calibration robot 310 are operating correctly.

For example, the pad 441 may be electrically connected to a driver (not shown) installed in the calibration robot 310 via one of the probes 313 of the arm 311 of the calibration robot 310. The pad 442 may be electrically connected to a comparator (not shown) installed in the calibration robot 310 via another of the probes 313 of the arm 311 of the calibration robot 310.

Therefore, whether the probes 313 of the arm 311 of the calibration robot 310 are operating correctly can be checked by determining whether a signal is input to the comparator.

The contact terminals 430 electrically connect the socket 410 to the ATE 350 via the PCB.

During the calibration operation, the ATE 350 is connected to the test board 400 via the wire cables 351 and 340, and the calibration robot 310 for calibrating the ATE 350 detects the at least one alignment mark 420 positioned around the socket 410, and moves so as to align itself with the test board 400. Further, the calibration robot 310 directly probes the pad 440 to check whether the calibration robot 310 is operating correctly. The calibration robot 310 then detects test signals output from the ATE 350 by directly probing the contact terminals 411 of the socket 410, which are in contact with a BGA package (not shown) during testing, and stores calibration data necessary for calibrating the ATE 350 in the memory of the ATE 350.

During the DUT test operation, the DUT (BGA or μ-BGA package) is mounted to the test board 400 such that the spherical contacts thereof are in contact with the contact terminals of the socket 410. When the ATE 350 tests the DUT, the ATE 350 compensates the results obtained from the test of the DUT using the stored calibration data.

As described above, when a calibration operation and a test operation are repeated using a test board according to the present invention, it is not necessary to repeatedly attach and detach an additional jig. Thus, less time is expended when carrying at the repeated test operations.

Also, when an ATE calibration is carried out using the test board according to the present invention, accurate calibration data can be obtained.

Moreover, when an ATE calibration operation is performed using the test board according to the present invention, an inductive effect otherwise caused by the presence of the jig set can be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A test board which is selectively usable as an interface between an integrated circuit device under test (DUT) and an automatic test equipment (ATE) and as an interface between a calibration apparatus and the ATE, wherein the calibration apparatus includes contact probes and the DUT includes terminals, said test board comprising:

a socket, for electrically connecting to the ATE, which includes a plurality of contact terminals which are configured to directly contact the terminals of the DUT during a test operation and to directly contact the contact probes of the calibration apparatus during a calibration operation;

an alignment mark which is positioned adjacent the socket and which can be sensed by the calibration apparatus during the calibration operation; and a test pad which is positioned adjacent the socket and which is configured to directly contact a test probe of the calibration apparatus for checking an operational state of the calibration apparatus.

2. The test board of claim 1, wherein DUT is a ball grid array package or a micro ball grid array package.

3. The test board of claim 1, further comprising conductive lines that electrically connect the socket and ATE.

4. A system for testing an integrated circuit device under test (DUT) having terminals, said system comprising:

an automatic test equipment (ATE);

a calibration apparatus having contact probes for calibrating the ATE and having a test probe for checking an operational state of the calibration apparatus; and a test board comprising (a) a socket, which is electrically connected to the ATE, and which includes a plurality of contact terminals which are configured to directly contact the terminals of the DUT during a test operation and to directly contact the contact probes of the calibration apparatus during a calibration operation, (b) an alignment mark which is positioned adjacent the socket and which can be sensed by the calibration apparatus during the calibration operation, and (c) a test pad which is positioned adjacent the socket and which is configured to directly contact the test probe of the calibration apparatus.

5. The system of claim 4, further comprising a main load board electrically connected between the ATE and the contact terminals of the socket of the test board.

6. The test board of claim 4, wherein DUT is a ball grid array package or a micro ball grid array package.

7. A method of calibrating an automatic test equipment (ATE) which tests an integrated circuit device under test (DUT) having terminals, said method comprising:

electrically connecting the ATE to a socket of a test board, the socket including a plurality of contact terminals which are configured to directly contact the terminals of the DUT during a test operation;

using an alignment mark positioned adjacent the socket to align a calibration apparatus with the test board;

directly contacting a test pad positioned adjacent the socket with a test probe of the calibration apparatus to determine whether the calibration apparatus is operating correctly; and directly contacting the contact terminals of the socket with calibration probes of the calibration apparatus to detect calibration data for calibrating the ATE.

8. The method of claim 7, wherein the DUT is a ball grid array package or a micro ball grid array package.

9. The method of claim 7, further comprising removing the direct contact between the test pad and the test probe and the direct contact between the contact terminals and the calibration probes, and then conducting the test operation, wherein the test operation includes:

directly contacting the contact terminals of the socket with the terminals of the DUT;

using the ATE to test the DUT; and compensating test results of the ATE using the calibrating data.

* * * * *